United States Patent
Sharps et al.

(10) Patent No.: US 8,263,855 B2
(45) Date of Patent: Sep. 11, 2012

(54) MULTIJUNCTION SOLAR CELL WITH A BYPASS DIODE

(75) Inventors: Paul R. Sharps, Albuquerque, NM (US); Marvin Brad Clevenger, Albuquerque, NM (US); Mark A Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 130 days.

(21) Appl. No.: 12/776,120

(22) Filed: May 7, 2010

(65) Prior Publication Data
US 2010/0224239 A1 Sep. 9, 2010

Related U.S. Application Data

(63) Continuation of application No. 10/723,456, filed on Nov. 26, 2003, now abandoned, which is a continuation of application No. 09/999,598, filed on Oct. 24, 2001, now Pat. No. 6,680,432.

(51) Int. Cl.
- H01L 31/00 (2006.01)
- H01L 27/14 (2006.01)
- H01L 31/06 (2006.01)
- H01L 31/102 (2006.01)
- H01L 21/00 (2006.01)

(52) U.S. Cl. ........ 136/255; 136/249; 136/261; 136/262; 438/81; 438/93; 438/74; 257/431; 257/461; 257/458; 257/466

(58) Field of Classification Search .................. 136/255, 136/249, 261, 262; 438/81, 93, 74; 257/466, 257/461, 458, 431
See application file for complete search history.

(56) References Cited

U.S. PATENT DOCUMENTS

| | | |
|---|---|---|
| 4,245,386 A | 1/1981 | Kausche et al. |
| 4,759,803 A | 7/1988 | Cohen |
| 5,009,720 A | 4/1991 | Hokuyo et al. |
| 5,138,403 A | 8/1992 | Spitzer |
| 5,155,565 A | 10/1992 | Wenz et al. |
| 5,853,497 A | 12/1998 | Lillington et al. |
| 6,103,970 A | 8/2000 | Kilmer et al. |
| 6,184,458 B1 | 2/2001 | Murakami et al. |
| 6,248,948 B1 | 6/2001 | Nakagawa et al. |
| 6,278,054 B1 | 8/2001 | Ho et al. |

(Continued)

FOREIGN PATENT DOCUMENTS

EP 1056137 A1 5/2000

(Continued)

OTHER PUBLICATIONS

Marvin et al., Evaluation of multijunction solar cell performance in radiation environments, Conference Record of the 28th Photovoltaic Specialists Conference, pp. 1102-1105, published Sep. 15-22, 2000.
Board of Appeals Decision, Appeal 2008-003519, Apr. 23, 2010.

Primary Examiner — Jennifer Michener
Assistant Examiner — Marla D McConnell

(57) ABSTRACT

Apparatus and Method for Optimizing the Efficiency of a Bypass Diode in Solar Cells. In a preferred embodiment, a layer of TiAu is placed in an etch in a solar cell with a contact at a doped layer of GaAs. Electric current is conducted through a diode and away from the main cell by passing through the contact point at the GaAs and traversing a lateral conduction layer. These means of activating, or "turning on" the diode, and passing the current through the circuit results in greater efficiencies than in prior art devices. The diode is created during the manufacture of the other layers of the cell and does not require additional manufacturing.

44 Claims, 5 Drawing Sheets

| U.S. PATENT DOCUMENTS | | | | FOREIGN PATENT DOCUMENTS | | |
|---|---|---|---|---|---|---|
| 6,316,716 B1 | 11/2001 | Hilgrath | GB | 2346010 A | 7/2000 |
| 6,359,210 B2 | 3/2002 | Ho et al. | JP | S57-204180 | 12/1982 |
| 6,600,100 B2 | 7/2003 | Ho et al. | JP | H02-005575 | 1/1990 |
| 6,635,507 B1 | 10/2003 | Boutros et al. | JP | HO3-077382 | 4/1991 |
| 6,680,432 B2 | 1/2004 | Sharps et al. | JP | H05-048134 | 2/1993 |
| 6,864,414 B2 | 3/2005 | Sharps et al. | JP | 9-64397 A | 3/1997 |
| 2003/0140962 A1 | 7/2003 | Sharps et al. | JP | 2002-517098 | 6/2002 |
| 2004/0040593 A1 | 3/2004 | Ho et al. | WO | WO 99/62125 A1 | 12/1999 |

MULTIJUNCTION SOLAR CELL WITH A BYPASS DIODE

CROSS-REFERENCE TO RELATED APPLICATION(S)

This application is a continuation of U.S. Ser. No. 10/723,456, filed Nov. 26, 2003, which, in turn, is a continuation of U.S. patent application Ser. No. 09/999,598, filed Oct. 24, 2001, now U.S. Pat. No. 6,680,432.

This application also is related to U.S. patent application Ser. No. 10/773,343 filed Feb. 6, 2004, which is a continuation application of U.S.application Ser. No. 10/280,593, filed on Oct. 24, 2002, which is a continuation-in-part of U.S. application Ser. No 09/999,598, filed on Oct. 24, 2001.

This application is also related to U.S. patent application Ser. No. 10/336,247, filed Jan. 3, 2003, which is a continuation application of U.S. patent application Ser. No. 09/934,221, filed Aug. 21, 2001, now U.S. Pat. No. 6,600,100, which is a divisional of U.S. patent application Ser. No. 09/314,597, filed on May 19, 1999, now U.S. Pat. No. 6,278,054, which claims priority from U.S. Provisional Patent Application Ser. No. 60/087,206, filed on May 28, 1998. U.S. application Ser. No. 09/753,492, filed Jan. 2, 2001, now U.S. Pat. No. 6,359,210 is also a divisional of application Ser. No. 09/314,597.

FIELD OF THE INVENTION

The present invention relates to solar cells and methods for their fabrication, and more particularly to optimizing the efficiency of a bypass diode within solar cells.

DESCRIPTION OF THE RELATED ART

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in mobile and telephone communications have dramatically increased the demand for solar cells with improved power and energy conversion characteristics.

In satellite and other space related applications, the size, mass, and cost of a satellite power system is dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often used in arrays, an assembly of solar cells connected together in a series. The shape and structure of an array, as well as the number of cells it contains, are determined in part by the desired output voltage and current.

When all of the solar cells in an array are receiving sunlight or are illuminated, each cell will be forward biased. However, if any of the cells are not illuminated, because of shadowing or damage, those cells may become reversed biased in order to carry the current generated by the illuminated cells. This reverse biasing can degrade the cells and can ultimately render the cells inoperable. In order to prevent reverse biasing, a diode structure is often implemented.

The purpose of the bypass diode is to draw the current away from the shadowed or damaged cell. The current flows through the bypass diode and it becomes forward biased when the shadowed cell becomes reverse biased. Rather than forcing current through the shadowed cell, the diode draws the current away from the shadowed cell and maintains the connection to the next cell.

Different types of bypass diodes have been utilized in prior art. In some configurations the bypass diode is connected to the exterior of a solar cell array. This is a difficult device to manufacture, and charges the array assembler with a task perhaps better performed by the cell manufacturer. Another conventional method to provide bypass diode protection to a solar cell array has been to connect a bypass diode between adjacent cells, with the anode of the bypass diode connected to one cell and the cathode of the diode connected to an adjoining cell. However, this technique is complicated to manufacture and requires a very difficult and inefficient assembly method. Another technique for providing a bypass diode for each cell involves a recess formed onto the back of each cell and a bypassed diode being placed into this recess. This technique has not yet proven efficient to manufacture because of the delicacy of the cells and because the technique requires the connection of the adjoining cells to be formed by the assembler of the array as opposed to the cell manufacturer.

Given the foregoing, there is a necessity for an integral bypass diode which can be manufactured by the cell manufacturer as an integral part of the cell itself, taking the responsibility for the bypass away from the array assembler. Rather than working with an array assembler to develop the most efficient means of including a bypass diode as part of the array, the device demonstrated by this invention allows the cell manufacturers to simply give the array assemblers an all-in-one cell that can be tightly packed and arrayed without the necessity of adding an additional bypass diode device to the array.

U.S. Pat. No. 6,278,054 (the "'054 Patent") describes an integral bypass diode that attempts to address these drawbacks. However, the '054 Patent requires additional epitaxial layers to be grown on top of the multijunction cell structure, and the bypass diode described in the '054 Patent is for a homojunction made out of GaAs. Most of this additional epitaxial layer has to be etched off the front of the cell, leaving only a small area to be used as the bypass diode.

European Patent no. 1 056 137 A1, Application Serial No. 00109681.7 discloses a Schottky diode for a two junction or single junction device, in contrast to the device described herein.

SUMMARY OF THE INVENTION

A preferred embodiment of the present invention provides a method for manufacturing a bypass diode in a multijunction solar cell with at least three junctions.

In accordance with the purpose of the invention, as embodied and broadly described herein, the invention relates to an alternative and more effective way of optimizing the efficiency of and manufacturing a bypass diode so as to create a monolithic integral bypass diode that can be manufactured with a high rate of efficiency and when operable will require less voltage than prior art devices.

Advantages of the invention will be set forth, in part, in the description that follows and, in part, will be understood by those skilled in the art from the description herein.

BRIEF DESCRIPTION OF THE DRAWINGS

The accompanying drawings, which are incorporated in and constitute a part of this specification, illustrate an embodiment of the invention and, together with the description, serve to explain the principles of the invention.

DETAILED DESCRIPTION OF A PREFERRED EMBODIMENT

The following describes the present invention more fully with reference to the accompanying drawings, in which a preferred embodiment of the invention is shown. The present invention may, however, be embodied in many different forms and should not be construed as being limited to the embodiment set forth herein; this embodiment is provided so that this disclosure will be thorough and complete and will fully convey the invention to those skilled in the art.

The present invention relates to a multijunction solar cell with at least one integral monolithic bypass diode. The layers comprising the solar cell are particularly chosen for their combination of efficiency and manufacturability. As discussed below, one embodiment consists of a multijunction structure with at least three junctions, with a unique modified buffer structure.

The process of manufacturing the solar cell with an integral monolithic bypass diode is comprised of five distinct steps, which are described below.

Figure 1:
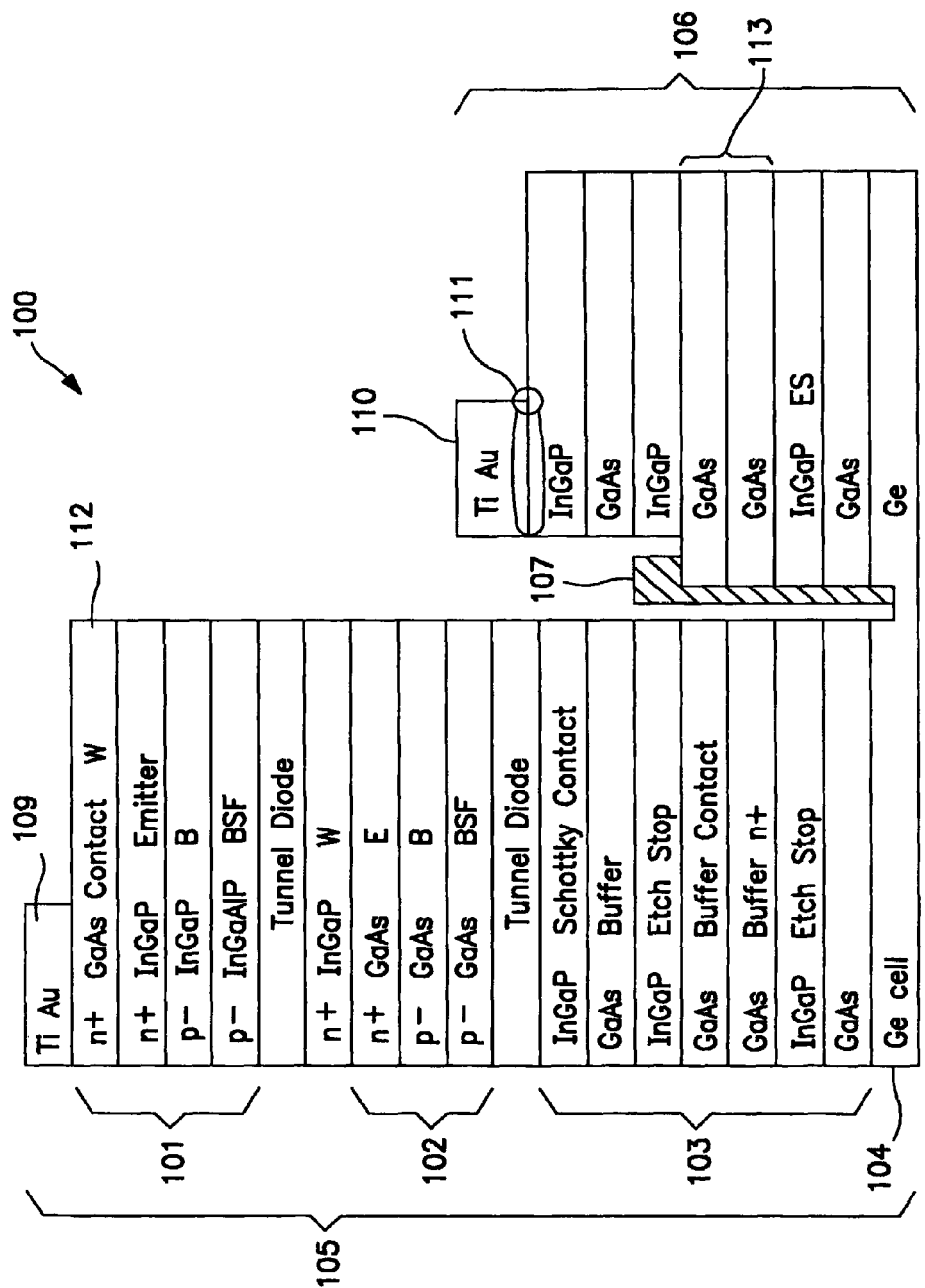
FIG. 1 illustrates one embodiment of the present invention, a multijunction solar cell, after the completion of all processing steps, illustrating the composition of such embodiment.
Figure 2:
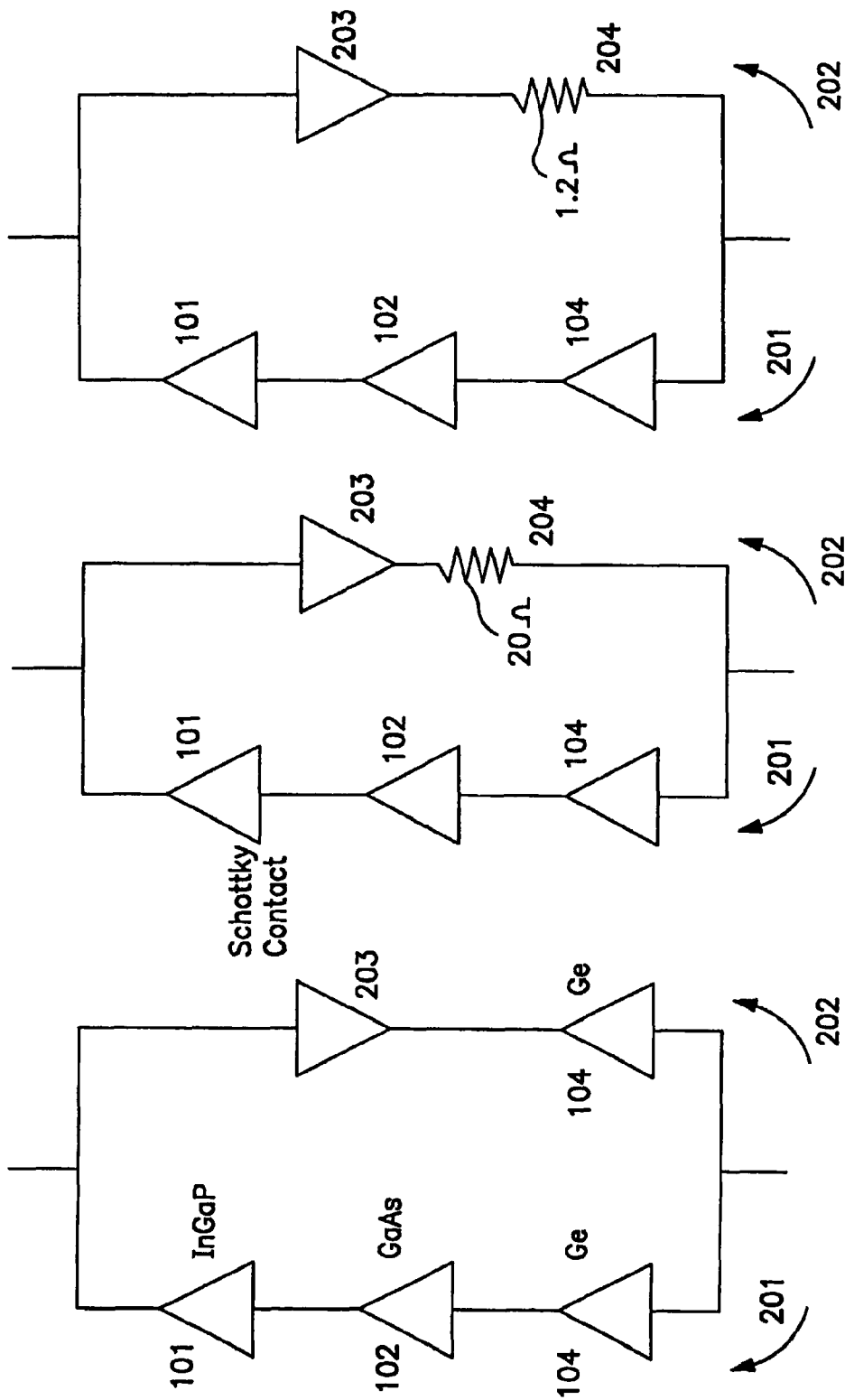
FIG. 2 illustrates the two paths current in the cell illustrated in FIG. 1 can take, given a particular set of circumstances.

FIG. 1 is an illustration of an embodiment of the invention, a monolithic solar cell with an integral bypass diode. FIG. 2 is a series of schematic drawings of the two possible current paths through the cell.

Figure 4:
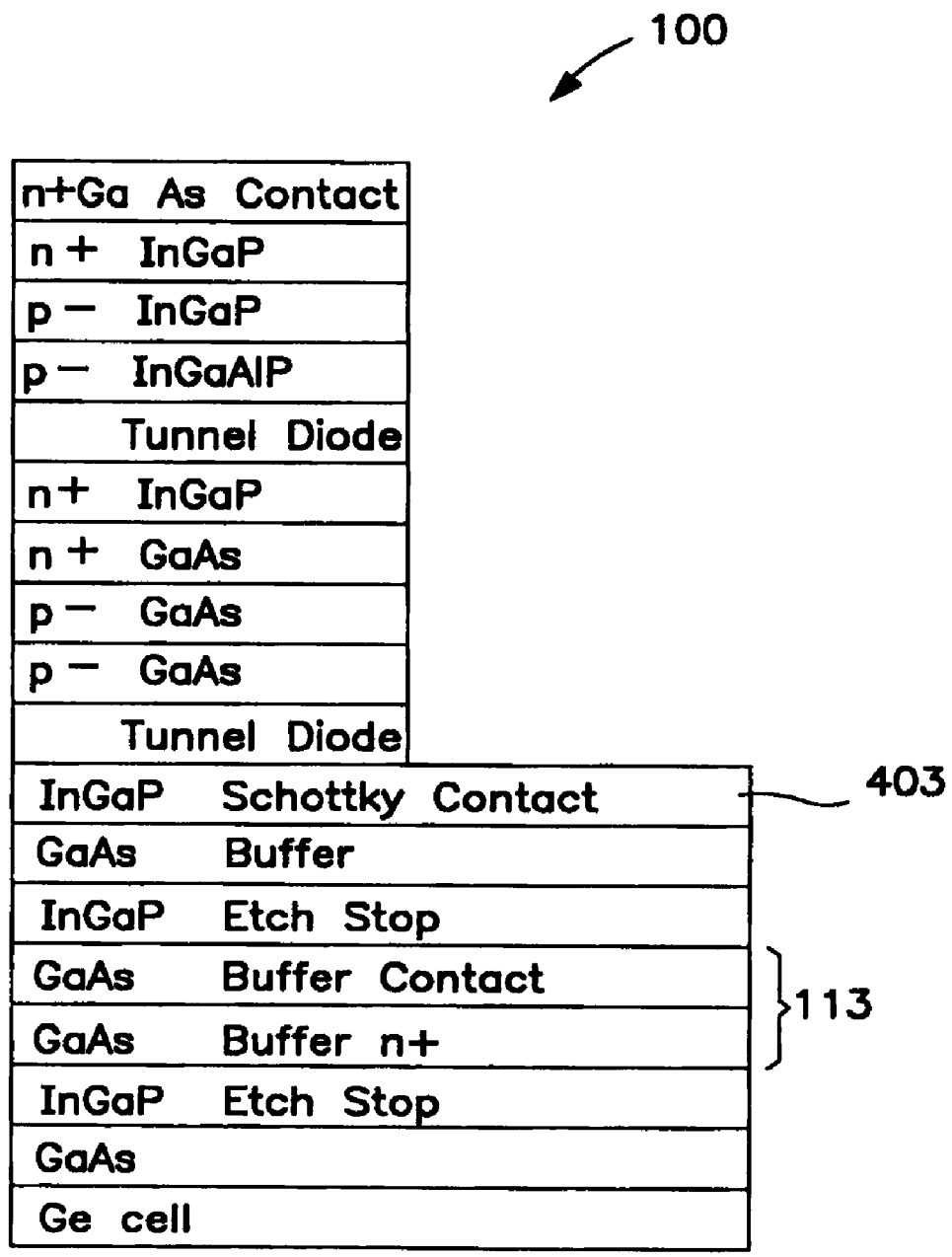
FIG. 4 illustrates a first processing step used to construct one embodiment of the present invention.

FIG. 1 shows a multijunction solar cell 100 with a cell of Indium Gallium Phosphorus (InGaP) 101 and a cell of Gallium Arsenide (GaAs) 102 over a GaAs buffer 103 on top of a Germanium (Ge) substrate 104. When the solar cell 100 is illuminated, both a voltage and a current are generated. FIG. 2A represents the solar cell as seen in FIG. 4, without the metalization 107 and lateral conduction layer 113 described below. If the solar cell is illuminated, there will be no barrier to the current following the cell path 201 through the layers of the solar cell: the Ge junction 104, the GaAs junction 102, and the InGaP junction 101.

However, when the solar cell 100 is not receiving sunlight, whether because of shading by a movement of the satellite, or as a result of damage to the cell, then resistance exists along the cell path 201. As solar cells exist in an array, current from illuminated cells must pass through shaded cells. If there were no diode, the current would force its way through the cell path 201, reversing the bias of such cells and degrading, if not destroying them.

If the cell contains a diode, however, the current can be offered an alternate, parallel path 202, and the shaded cells will be preserved. The problem with this concept has been the difficulty in creating a diode that is relatively easy to manufacture and which uses a very low level of voltage to turn on and operate. The invention described herein solves these problems.

If a cell is shaded or otherwise not receiving sunlight, in order for the current to choose the diode path 202, the turn on voltage for the diode path 202 must be less than the breakdown voltage along the cell path 201. The breakdown voltage along the cell path will typically be at least five volts, if not more. The Schottky contact 207 requires a relatively small amount of voltage to "turn on"—600 milivolts. However, to pass through the Ge junction 104, the bias of the Ge junction 104 must be reversed, requiring a large voltage. Reversing the bias of the Ge junction 104 requires approximately 9.4 volts, so nearly ten volts are needed for the current to follow the diode path 202 in FIG. 2A. Ten volts used to reverse the bias of the Ge junction is ten volts less than otherwise would be available for other applications. The device illustrated by FIG. 4 is therefore a functioning bypass diode, but an inefficient one from a power utilization perspective.

To address this inefficiency, in the metalization process in which the Titanium Gold (TiAu) contacts 109, 110 are added to the solar cell, an additional layer of metal 107 is added as well. In the embodiment shown in FIG. 1, the metal is TiAu, although practitioners in the art will be well aware that other metals can also be used.

The effect of the metal 107 is to "short" the Ge junction 104 to the base of the Ge cell 104. Because of the short, a minimal voltage is required to pass current between the layer 113 and the Ge substrate. No longer is a high voltage required to force the current through the Ge junction 104. The current flows easily through the "short path" 107. FIG. 2B provides a schematic representation. If the solar cell is shaded, no longer is the cell forced into reverse bias to pass the current of the array string. There is a much less resistive path, requiring a much lower voltage drop, for the current to pass through the bypass diode 202.

With the addition of the metalization 107, the Ge cell 104 is shorted. As a result, rather than a reverse biased diode with a 9.4 turn-on voltage, the current instead encounters an ohmic resistance path represented by the resistor 204.

The layer is doped to about 7 to 8 times $10^{17}$ cm$^3$ to do two things. First, it reduces the contact resistance of the metal layer 107 and second, it provides a low resistance path for the lateral conduction layer. Without the lateral conduction layer, the resistance at the resistor 204 is approximately 20 ohms. 20 ohms represents a significant drain on the current of the solar cell. To reduce this resistance, a lateral conduction layer 113 is added to the solar cell. FIG. 2C represents the current paths in the solar cell as depicted in FIG. 1. When the solar cell is shaded, the current will flow to the resistor 204. Because of the presence of the lateral conduction layer 113, the resistance at the resistor can be as low as 0.4 ohms.

Figure 3:
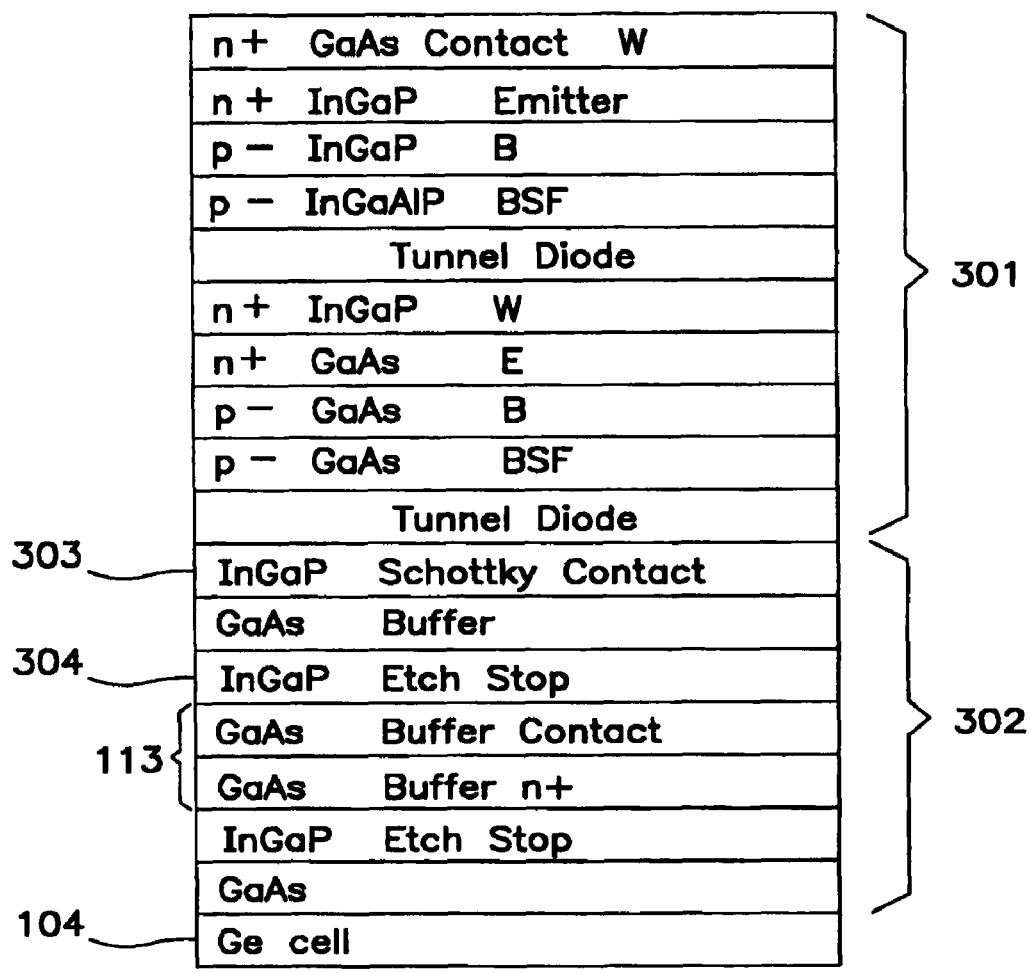
FIG. 3 illustrates one embodiment of the present invention, a multijunction solar cell, prior to any processing steps.

The manufacturing process for the solar cell 100 comprises five steps. FIG. 3 shows a multijunction solar cell 100 and the component parts: the multijunction structure 301 and the buffer structure 302. In the illustrated embodiment, a top cell comprised of an n-on-p InGaP$_2$ 101 is grown over a cell of n-on-p GaAs 102. A third diffused Ge junction 104 is formed due to diffusion of As during the growth of buffer layers 103.

A buffer exists between the upper junctions in the solar cell and the Ge substrate 104, because the upper junctions are fabricated of III-V material, and the entire cell is grown on a Ge substrate 104. Ge is a group IV element, so it has different lattice parameters than group III-V elements. Lattice matching is generally accepted among those skilled in the art as a way to increase the efficiency of a solar cell, and it follows that lattice mismatching decreases a cell's overall efficiency. To achieve lattice matching, the buffer layer is inserted in the manufacture process; normally it is a thick layer of GaAs grown over the Ge substrate. An InGaP layer lattice matches with a GaAs layer much better than with a Ge layer.

The buffer structure 302 is comprised of the following: an InGaP Schottky contact 303 as the top layer of the buffer structure 302. This will later form the Schottky diode. The buffer structure 302 is also comprised of an additional etch stop 304. The etch stop 304 enables the device to be more easily manufactured. Upon "wet etching" the etch stop creates barriers during processing which facilitate formation of the bypass diode. The lateral conduction layer 113 exists in this buffer layer, to more efficiently guide the current out of the diode, as discussed above.

As shown on FIG. 4, the first step in the manufacturing process is to make a "wet etch" that comes down into the cell 100 and terminates at the InGaP layer 403.

A TiAu contact 110 is formed upon the InGaP layer 403. A TiAu contact 109 is formed at the top of the cell to make an ohmic contact with the $n^+$-GaAs layer 112. The TiAu contact 110 on the InGaP layer 403 makes a Schottky contact, which is non-ohmic. In other words, instead of looking like a resistor, such contact 403 and the TiAu contact 110 forms a diode.

Figure 5:
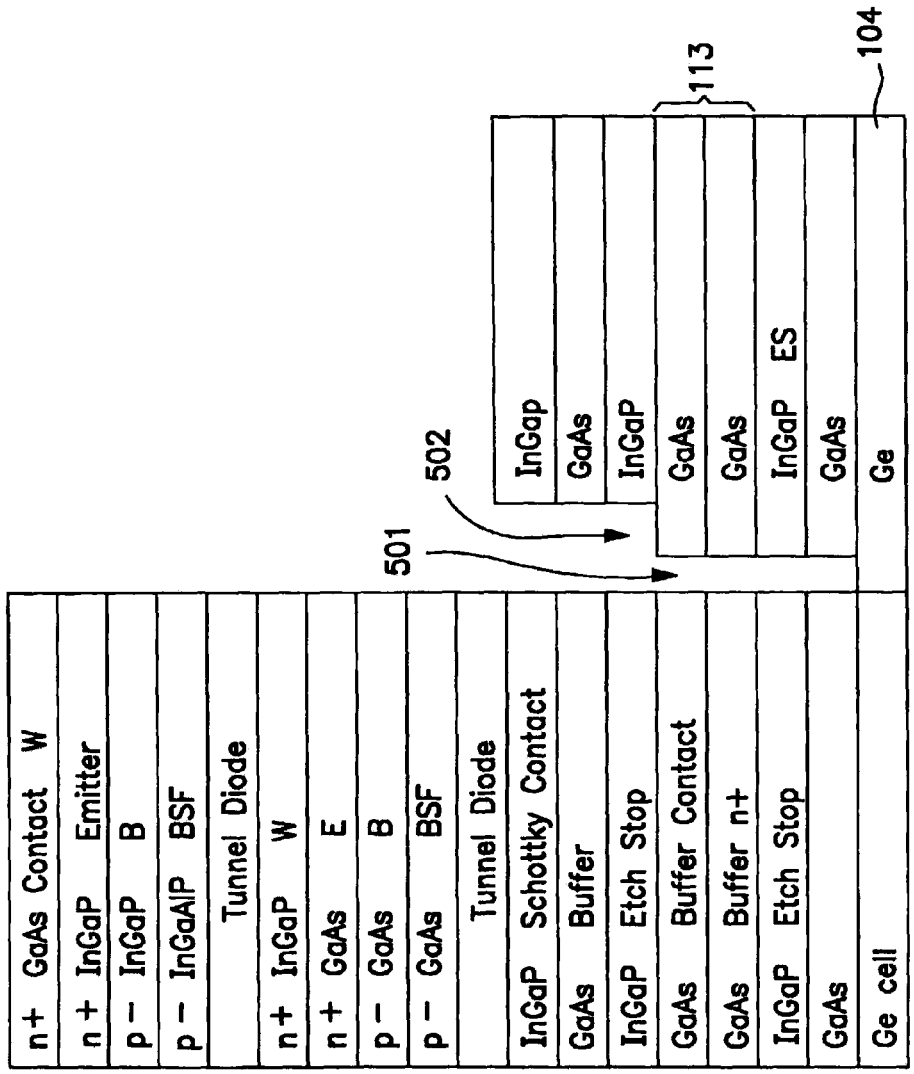
FIG. 5 illustrates the second and third processing steps used to construct one embodiment of the present invention.

The second step in the manufacturing process is demonstrated in FIG. 5. FIG. 5 shows a "mesa etch" 501 down to the level of the Ge cell 104. The primary purpose of this step is to create a true diode 106, electrically isolating the junctions 105 within the solar cell from the diode 106. When the entire solar cell is manufactured and the metal contacts are bound and the cell is packaged, the cell 105 and the diode 106 will be parallel, yet electrically separate.

The third step is a "shunt etch" 502, which provides a "shelf" on which the metal 107 in the next step will be laid. To make etches in the middle of manufacturing without etch stops among the layers, one would have to use a "minute etch" which would be extremely difficult to use with any degree of precision in this instance. The etch stop 304 allows the solar cell to be manufactured more efficiently.

The fourth step is the metalization process. The TiAu contacts 109, 110 are added, and the metal layer 107 is added. In this embodiment the metal comprising the layer is TiAu. Where the TiAu contact 110 meets the InGaP layer 403, a Schottky contact is created.

At the TiAu contact 109 on top of the cell, the TiAu makes an ohmic contact to n-type GaAs 112. That is an ordinary cell conduction for this type of cell to persons skilled in the art. With the TiAu contact 110 at the InGaP layer 403, a Schottky contact is created. However, because the object is to "short out" the Ge cell 104, the contact was made to the highly doped n+-GaAs cell 113. Layer 113 is also a lateral conduction layer. Upon making the contact to the GaAs layer 113, a resistor is created. The resistance at the resistor 204 was approximately 20 ohms, as illustrated in FIG. 2A. 20 ohms of power dissipation can make the cell too inefficient from a power utilization perspective.

The etch stop at the GaAs buffer contact 304 alleviates this problem. The GaAs buffer contact 113 is n+ doped at the same level as the GaAs buffer contact 112 at the top of the cell. This creates a cell with the same quality of contact between the TiAu contact 109 and the GaAs contact layer 112 at the top of the cell as the metal contact 107 with the GaAs layer 113.

Modifying the thicknesses of the various layers in the diode 106 is another way to decrease resistance in the diode 106.

The lateral conduction layer 113 also alleviates the resistance through the diode 106, from 20 ohms to as low as 0.4 ohms. The current path passes through the diode 106, and the thickness of the diode would ordinarily cause some resistance, but the lateral conduction layer 113 helps the current move to the metal more efficiently. In this embodiment, the lateral conduction layer is made of highly doped $n^+$-GaAs.

The shunt layer 107 can also be made to partially or completely surround the contact 110, further lowering the series resistance.

The lateral conduction layer 113 and the metalization 107 are the two most important means to lessen the amount of voltage needed to "turn on" the diode and bypass the shaded cell. By reducing the series resistance, the amount of localized $I^2R$ heating is also reduced. The process is also unique becaues the amount of processing steps are reduced (compared to the '054 Patent), as the bypass diode layers are grown internally to the buffer layers of the cell, rather than as additional layers that have to be grown on top of the cell (as in the '054 Patent). The current device provides for a low bypass diode turn on, as well as a low series resistance bypass diode. Completion of the bypass diode circuit requires a soldered or welded interconnect made between contacts 109 and 110. This can be done as part of the usual interconnect weld.

The fifth step in the manufacturing process is to apply the anti-reflective coating and include etches where external contacts will be attached.

As can be seen from the foregoing, the process by which the diode is manufactured is integral to the manufacture of the cell, and does not require additional manufacturing steps or additional layers to be grown on the cell.

While we have described our preferred embodiments of the present invention, it is understood that those skilled in the art, both now and in the future, may make various improvements and enhancements which fall within the scope of the claims which follow. These claims should be construed to maintain the proper protection for the invention first disclosed.

What is claimed is;

1. An integrated semiconductor structure comprising:
a multijunction solar cell including a first photoactive junction formed in a substrate forming a bottom subcell where there are no subcells located between the bottom subcell and the lower surface of the substrate, and a second photoactive junction formed in a region overlying said bottom subcell and forming a second subcell;
a buffer structure disposed on the substrate and located between the substrate and the second subcell; and
means for passing current when said multijunction solar cell is shaded, wherein said means is on the same substrate as the multijunction solar cell, wherein said means and said buffer structure have an identical sequence of semiconductor layers, wherein each semiconductor layer in the means has the same composition as the corresponding layer in the buffer structure and is provided in a process that is the same as the process for providing the corresponding layer in the buffer structure, and wherein the means for passing current is electrically connected in parallel across the multijunction solar cell.

2. The tructure as defmedin claim 1, wherein said means for-passing current is a bypass diode formed on the substrate.

3. The structure as defined in claim 2, wherein the bypass diode has a Schottky junction.

4. An integrated semiconductor structure comprising:
a multijunction solar cell including a bottom subcell formed on a substrate where there are no subcells between the bottom subcell and the lower surface of the substrate;
a buffer structure overlying the substrate; and
means for passing current when said multijunction solar cell is shaded, wherein said means is on the same substrate as the multijunction solar cell, wherein said means and said buffer structure have an identical sequence of semiconductor layers, wherein each semiconductor layer in the means has the same composition as the corresponding layer in the buffer structure, wherein each semiconductor layer in the means is provided in a process that is the same as the process for providing the corresponding layer in the buffer structure, and wherein the means for passing current is electrically connected in parallel across the multijunction solar cell.

5. The structure as defined in claim 4, wherein said bottom subcell is formed on a first portion of the substrate and said means for passing current is a bypass diode formed on a second portion of the substrate that is laterally spaced from said first portion.

6. The structure as defined in claim 5, wherein said bypass diode is electrically connected across the subcells of the multijunction solar cell to protect said subcells against reverse biasing.

7. The structure as defined in claim 5 wherein the bypass diode has a Schottky junction.

8. An integrated semiconductor structure comprising:
a multijunction solar cell including a first solar cell formed on a substrate;
a buffer structure overlying the substrate; and
a bypass diode, on the same substrate as the solar cell, wherein the bypass diode is directly electrically connected to a base of said first solar cell and to a top cell of the multijunction solar cell for passing, current when said multijunction solar cell is shaded, wherein said bypass diode and said buffer structure have an identical sequence of semiconductor layers, wherein each semiconductor layer in the bypass diode has the same composition as the corresponding layer in the buffer structure, and wherein each semiconductor layer in the bypass diode is provided in a process that is the same as the process for providing the corresponding layer in the buffer structure; and further wherein
said first solar cell is the bottom solar cell where there are no solar cells between the first solar cell and the lower surface of the substrate.

9. The structure as defined in claim 8, wherein said first solar cell is formed on a first portion of the substrate and said bypass diode is formed on a second portion of the substrate spaced apart from said first portion.

10. The structure as defined in claim 8, further comprising a metal layer connecting said bypass diode to the base of the first solar cell.

11. An integrated semiconductor structure comprising:
a multijunction solar cell including first and second solar cells on a substrate;
a buffer structure overlying the substrate and located below the second solar cell;
means for passing current when said multijunction solar cell is shaded; and
a deposited metal layer connecting said multijunction solar cell and said means for passing' current, said deposited metal layer contained within said semiconductor structure and entirely on a surface of said means for passing current, wherein
one end of said metal layer is coupled to a base of said first solar cell and another end of said metal layer is coupled to one terminal of said means for passing current; and further wherein
said means for passing current and said buffer structure have an identical sequence of semiconductor layers, wherein each semiconductor layer in the means for passing current has the same composition as the corresponding layer in the buffer structure, wherein each semiconductor layer in the means is provided in a process that is the same as the process for providing the corresponding layer in the buffer structure, and wherein the metal layer is disposed on sides of layers between the base of the first solar cell and the terminal in the means for passing current.

12. The structure as structure as defined in claim 11, wherein said first solar cell is formed on a first portion of the substrate, and said means for passing current is a bypass diode formed on a second portion of the substrate.

13. The structure as defined in claim 11, wherein said multijunction solar cell and said means for passing current are separated by a trough, and said metal layer lies over said trough.

14. The structure as defined in claim 13, wherein, said means for passing current is electrically connected across at least said, first and second cells to protect said first and second cells against reverse biasing.

15. A solar cell semiconductor device comprising:
an integral semiconductor body having a sequence of layers of semiconductor material including a first region in which the sequence of layers of semiconductor material forms a first cell of a multijunction solar cell and a buffer structure; and
a second region laterally spaced apart from said first region and in which the sequence of layers corresponding to the sequence of layers forming said buffer structure forms a bypass diode to protect said multijunction solar cell against reverse biasing,
a metal layer entirely on a surface of the bypass diode and disposed in the space between the first and second region, wherein the metal layer electrically connects the bypass diode to the multijunction solar cell and electrically shorts a plurality of layers of the second region between the multijunction solar cell and the bypass diode, wherein
the sequence of semiconductor layers in the first region forming said buffer structure and the sequence of semiconductor layers in the second region forming, said bypass diode are identical, wherein each semiconductor layer in the buffer structure has the same composition as the corresponding layer in the bypass diode, and wherein each semiconductor layer in the bypass diode is provided in a process that is the same as the process for providing the corresponding layer in the buffer structure.

16. A solar cell semiconductor device comprising:
a substrate;
a sequence of layers of material deposited on said substrate, including a first region in which the sequence of layers of material forms at least one cell of a multijunction solar cell and a buffer structure, and a second region in which the corresponding sequence of layers forms a bypass diode to protect said cell against reverse biasing, wherein the sequence of layers in the first region forming said buffer structure and the sequence of layers in the second region forming said bypass diode arc identical, wherein each layer in the first region has the same composition and as the corresponding layer in the second region; and
a first discontinuous lateral semiconductor conduction layer directly on said substrate wherein the first discontinuous lateral semiconductor conduction layer includes a first portion in the bypass diode that is adapted to electrically contact a metal layer disposed on a side of the discontinuous lateral conduction layer and a second portion in the bypass diode that is laterally spaced away.

from the first portion and adapted to electrically contact an active region of said bypass diode.

17. A device as defined in claim 16, wherein said lateral conduction layer in the first region is physically separated from the lateral conduction layer in the second region.

18. A device as defined in claim 16, wherein said lateral conduction layer is a highly doped layer.

19. A device as defined in claim 18, wherein said lateral conduction layer is composed of GaAs.

20. A device as defined in claim 16, wherein one of the layers of said sequence of layers is an etch stop layer, and a second lateral conduction:layer is disposed directly over said etch stop layer.

21. A device as defined in claim 16, wherein said substrate includes a photoactive junction.

22. A device as defined in claim 21, wherein said substrate is germanium.

23. A device as defined in claim 21, wherein said substrate forms an electrical connection path between said multijunction solar cell and said bypass diode.

24. A device as defined in claim 16
wherein the metal layer is disposed on a portion of said substrate and over at least a portion of said second region and functioning to (i) electrically short layers of said second region, and (ii) connect the substrate to a second lateral conduction layer to complete the electrical circuit between the multijunction solar cell and the bypass diode.

25. A solar cell semiconductor device comprising:
a substrate;
a sequence of layers of semiconductor material deposited on said substrate including a first region in which the sequence of layers of semiconductor material forms at least one cell of a multijunction solar cell and a buffer structure, and a second region in which the corresponding sequence of layers forms a bypass diode to protect said at least one cell of a multijunction solar cell against reverse biasing, wherein the sequence of layers in the first region forming said buffer structure and the sequence of layers in the second region forming said bypass diode are identical, wherein each layer in the first region has the same composition as the corresponding layer in the second region and is provided in a process that is the same as the process for providing the corresponding layer in the second region; and
a lateral conduction semiconductor layer deposited on said substrate including a first portion disposed in said first region, and a second portion disposed in said second region and physically separated from said first portion, wherein said second portion of said lateral conduction semiconductor layer includes a first region that directly and electrically contacts a first InGaP layer of said bypass diode and a second region laterally spaced apart from the first region that directly and electrically contacts a first metal layer.

26. A device as defined in claim 25, wherein said lateral conduction layer is a highly doped layer.

27. A device as defined in claim 25, wherein said lateral conduction layer is composed of GaAs.

28. A device as defined in claim 25, wherein one of the layers of said sequence of layers is an etch stop layer, and said lateral conduction layer is disposed directly over said etch stop layer.

29. A device as defined in claim 25, wherein said bypass diode further comprises a GaAs layer disposed over said first InGaP layer, and a second InGaP layer disposed over said GaAs layer.

30. A device as defined in claim 29, further comprising a second metal layer deposited over said second InGaP layer and forming a Schottky junction with said second InGaP layer.

31. A device as defined in claim 25, wherein said substrate includes a photoactive junction.

32. A device as defined in claim 25 wherein said substrate is germanium.

33. A device as defined in claim 25, wherein said substrate forms an electrical connection path between said multijunction solar cell and said bypass. diode.

34. A device as defined in claim 33, wherein the first metal layer is disposed on a portion of said substrate and over at least a portion of said second region and functioning to connect the substrate to a portion of said lateral conduction layer for completing the electrical circuit between the multijunction solar cell and the bypass diode.

35. A solar cell semiconductor device comprising:
a substrate;
a sequence of layers of semiconductor material deposited on said substrate, including a first region in which the sequence of layers of semiconductor material forms at least one cell of a multijunction solar cell and a buffer structure;
a second region in which the corresponding sequence of layers forms a bypass diode to protect said cell against reverse biasing, wherein the sequence of layers in the first region forming said buffer structure and the sequence of layers in the second region forming said bypass diode are identical, wherein each layer in the first region has the same composition as the corresponding layer in the second region and is provided in a process that is the same as the process for providing the corresponding layer in the second region; and
wherein said sequence of layers includes a highly conductive discontinuous lateral semiconductor conduction layer deposited on said substrate
and wherein the discontinuous lateral semiconductor conduction layer includes a first portion in the bypass diode for making direct electrical contact with a first active layer of said bypass diode and a second portion in the bypass diode laterally spaced away from the first portion and adapted to form a contact region beneath the active layer to allow said bypass diode to be electrically connected to said multijunction solar cell.

36. A device as defined in claim 35, further comprising a metal layer deposited on a portion of said substrate and over at least a portion of said second region and functioning to connect the substrate to a portion of said lateral conduction layer for completing the electrical circuit between the multijunction solar cell and the bypass diode.

37. A device as defined in claim 35, wherein said lateral conduction layer includes a first portion disposed in said first region, and a second portion disposed in said second region and separated from the first portion.

38. A device as defined in claim 35, wherein said lateral conduction layer is a highly doped layer composed of GaAs.

39. A device as defined in claim 37, wherein said second portion of said lateral conduction layer makes electrical contact with the first active layer of said bypass diode.

40. A solar cell semiconductor device comprising:
a substrate;
asequence of layers of semiconductor material deposited on said substrate, including a first region in which the sequence of layers of semiconductor material forms at least one cell of a multijunction solar cell and a buffer structure;

a second region, laterally spaced, apart from said first region, and having an identical sequence of layers as in said first region, wherein each layer in the first region has the same composition as the corresponding layer in the second region and is provided in a process that is the same as the process for providing the corresponding layer in the second region; and a metal layer deposited on a portion of said substrate and over at least a portion of said second region for electrically shorting semiconductor layers between the substrate and a lateral conduction semiconductor layer of said second region to enable a bypass diode to be formed in said second region, said metal layer contained within said solar cell semiconductor device.

41. A device as defined in claim 40, wherein said metal layer connects said multijunction solar cell and said bypass diode with one end of said metal layer being coupled to the base of said one solar cell and another end of said metal layer is coupled to one terminal of said bypass diode.

42. A device as defined in claim 40, wherein said first portion and said second portion are separated by a trough, and said metal layer lies over at least a portion of said trough.

43. A device as defined in claim 40, wherein said bypass diode is electrically connected by said metal layer across said solar cell to protect said solar cell against reverse biasing.

44. A device as defined in claim 40, wherein the lateral conduction layer is on said substrate and electrically connects the multijunction solar cell to said bypass diode.

* * * * *